US012663486B2

(12) United States Patent
Jaroszynski

(10) Patent No.: US 12,663,486 B2
(45) Date of Patent: Jun. 23, 2026

(54) FORCE MAGNETOMETER FOR REEL-TO-REEL ASSESSMENT OF SUPERCONDUCTING TAPES

(71) Applicant: THE FLORIDA STATE UNIVERSITY RESEARCH FOUNDATION, INC., Tallahassee, FL (US)

(72) Inventor: Jan J. Jaroszynski, Tallahassee, FL (US)

(73) Assignee: THE FLORIDA STATE UNIVERSITY RESEARCH FOUNDATION, INC., Tallahassee, FL (US)

( * ) Notice: Subject to any disclaimer, the term of this patent is extended or adjusted under 35 U.S.C. 154(b) by 175 days.

(21) Appl. No.: 18/484,917

(22) Filed: Oct. 11, 2023

(65) Prior Publication Data

US 2024/0151787 A1 May 9, 2024

Related U.S. Application Data

(60) Provisional application No. 63/382,220, filed on Nov. 3, 2022.

(51) Int. Cl.
| | |
|---|---|
| *G01R 33/12* | (2006.01) |
| *G01R 33/38* | (2006.01) |
| *G01R 33/421* | (2006.01) |

(52) U.S. Cl.
CPC ..... *G01R 33/1238* (2013.01); *G01R 33/3804* (2013.01); *G01R 33/421* (2013.01)

(58) Field of Classification Search
CPC ............ G01R 33/1238; G01R 33/3804; G01R 33/421; G01R 33/1246; G01R 33/3815
See application file for complete search history.

(56) References Cited

U.S. PATENT DOCUMENTS

| | | | | | |
|---|---|---|---|---|---|
| 4,400,745 | A | * | 8/1983 | Shu | G11B 15/46 |
| | | | | | 360/71 |
| 6,034,527 | A | * | 3/2000 | Schiller | G01R 33/0094 |
| | | | | | 324/225 |

(Continued)

FOREIGN PATENT DOCUMENTS

| | | | |
|---|---|---|---|
| CN | 206348380 U | * | 7/2017 |
| CN | 107505493 A | | 12/2017 |

(Continued)

OTHER PUBLICATIONS

Y. Li, S. Chen, M. Paidpilli, R. Jain, C. Goel and V. Selvamanickam, "A Reel-to-Reel Scanning Hall Probe Microscope for Characterizing Long REBCO Conductor in Magnetic Fields Up to 5 Tesla," in IEEE Transactions on Applied Superconductivity, vol. 32, No. 4, pp. 1-6, Jun. 2022 (Year: 2022).*

(Continued)

*Primary Examiner* — Daniel R Miller
(74) *Attorney, Agent, or Firm* — Eversheds Sutherland (US) LLP

(57) ABSTRACT

An apparatus is provided for reel-to-reel assessment of superconducting tapes (for example, REBCO CC tape) at low temperatures (for example, less than or equal to 65K). For example, the apparatus may be a force magnetometer. The apparatus may include one or more reels and pulleys used to move the superconducting tape into and out of a cryostat. The apparatus may also include a permanent magnet or electromagnet provided at a low temperature proximate to the tape. The magnet induces screening currents in the tape. The apparatus may also include an electric motor used to drive movement of the tape relative to the magnet. A tension meter may be provided to measure a tension of the tape. Alternatively, a current provided to the motor may also be measured. The apparatus may be used to measure the (Continued)

300 —⟍

302 —⟍ | Moving a superconducting tape through a cryostat, wherein the cryostat includes a magnet or electromagnet, and wherein the superconducting tape is moved proximate to the magnet or electromagnet 304 —⟍ | Measuring a tension of the superconducting tape using a device 306 —⟍ | Determining a critical current of the superconducting tape based on the tension critical current at various positions on the superconducting tape at the low temperatures.

13 Claims, 3 Drawing Sheets

(56)  References Cited

U.S. PATENT DOCUMENTS

| | | | | |
|---|---|---|---|---|
| 6,452,375 | B1 | 9/2002 | Coulter et al. | |
| 2010/0227765 | A1* | 9/2010 | Ueno .................. | G01R 33/072 |
| | | | | 505/310 |
| 2011/0140710 | A1* | 6/2011 | Ha ..................... | G01R 33/1246 |
| | | | | 324/537 |
| 2020/0200841 | A1 | 6/2020 | Usoskin et al. | |

FOREIGN PATENT DOCUMENTS

| | | | |
|---|---|---|---|
| CN | 113281687 A | | 8/2021 |
| KR | 101741453 B1 | * | 6/2017 |

OTHER PUBLICATIONS

J. Jaroszynski, et al., Supercond. Sci.Technol. 35, 095009 (2022).
J. Song, et al., IEEE Trans. Appl. Supercond. 32 (6), 4300206 (2022).
Y. Iwasa, et al., IEEE Trans. Appl. Supercond. 25 (3), 4301205 (2015).
K. Takahashi, et al., IEEE Trans. Appl. Supercond. 31 (5), 4602305 (2021).
Y. Yanagisawa, M. Hamada, K. Hashi, and H. Maeda, Supercond. Sci. Technol., 35 (4), 044006 (2022).
X. Zhang, et al., IEEE Trans. Appl. Supercond. 31 (8), 4604404 (2021).
R. Gupta, et al., IEEE Trans. Appl. Supercond. 26 (4), 4100705 (2016).
H. Bai, et al., IEEE Trans. Appl. Supercond. 30 (4), 4300405 (2020).
S. Hahn, et al., Nature, 570, 496-499 (2019).
J. van Nugteren, et al., IEEE Trans. Appl. Supercond. 28 (4), 4008509 (2018).

"The world's strongest NMR system for structural biology arrives at Instruct Centre IT." https://inext-discovery.eu/news/worldsstrongest-nmr-system-for-structural-biology-arrives-at-instruct-centre-it/.
"Superconductors: Global Markets." https://www.bccresearch.com/market-research/advanced-materials/superconductors-globalmarkets-report.html.
"Fusion market." https://www.transparencymarketresearch.com/fusion-power-market.html.
"Huge Growth in Fusion Energy Industry." https://www.forbes.com/sites/melaniewindridge/2022/07/14/huge-growth-in-fusionenergy-industry-shows-new-report/?sh=2821f84978e3.
"Fusion startup plans reactor with small but powerful superconducting magnets." https://www.science.org/content/article/fusionstartup-plans-reactor-small-powerful-superconducting-magnets.
"Eddy currents," Wikipedia. https://en.wikipedia.org/wiki/Eddy current.
A. Xu, et al., Supercond. Sci.Technol. 23 (1), 014003 (2010).
V. Braccini, et al., Supercond. Sci. Technol. 24 (3), 035001 (2011).
A. Xu, V. Braccini, J. Jaroszynski, Y. Xin, and D. C. Larbalestier, Phys. Rev. B, 86 (11), 115416 (2012).
A. Xu, et al., APL Mater. 2 (4), 046111 (2014).
A. Xu, et al., IEEE Trans. Appl. Supercond. 25, 6603105 (2015).
A. Xu, J. Jaroszynski, F. Kametani, and D. Larbalestier, Appl. Phys. Lett. 106 (5), 052603 (2015).
Xu, et al., Sci. Rep., 7, 6853 (2017).
L. Rossi, et al., Supercond. Sci. Technol. 29 (5), 054006 (2016).
X. Hu, L. Rossi, et al., IEEE Trans. Appl. Supercond. 27 (4), 9000205 (2017) .
J. Y. Coulter, J. Willis, and J. Hanisch, AIP Conf. Proc. 986, 471 (2008).
"Commonwealth Fusion Systems Statistical Quality Assurance." Unpublished, 2020.
A. Francis, et al., Supercond. Sci. Technol., 33 (4), 044011 (2020).
International Search Report & Written Opinion of the International Searching Authority mailed Nov. 20, 2024.
Ohshima S et al: "New contactless J"c-measurement system for HTS coated conductors", Physica C, North-Holland Publishing, Amsterdam, NL, vol. 445-448, Oct. 1, 2006 (Oct. 1, 2006), pp. 682-685, XP025120578, ISSN: 0921-4534, DOI: 10.1016/J.PHYSC.2006.05.004 [retrieved on Oct. 1, 2006].

* cited by examiner

300

302 — Moving a superconducting tape through a cryostat, wherein the cryostat includes a magnet or electromagnet, and wherein the superconducting tape is moved proximate to the magnet or electromagnet 304 — Measuring a tension of the superconducting tape using a device 306 — Determining a critical current of the superconducting tape based on the tension

FORCE MAGNETOMETER FOR REEL-TO-REEL ASSESSMENT OF SUPERCONDUCTING TAPES

CROSS-REFERENCE TO RELATED APPLICATIONS

This application claims priority to and benefit of U.S. provisional patent application No. 63/382,220, filed Nov. 3, 2022, which is herein incorporated by reference.

STATEMENT REGARDING FEDERALLY SPONSORED RESEARCH

This invention was made with government support under NSF1644779 awarded by the National Science Foundation. The government has certain rights in the invention.

BACKGROUND

Superconducting tapes may be used in various applications, such as cables, electric motors, transformers, and electromagnets, for example. The use of superconducting tapes in nuclear fusion reactor electromagnets has also been recently discussed.

BRIEF DESCRIPTION OF THE DRAWINGS

The detailed description is set forth with reference to the accompanying drawings. The use of the same reference numerals indicates similar or identical components or elements; however, different reference numerals may be used as well to indicate components or elements which may be similar or identical. Various embodiments of the disclosure may utilize elements and/or components other than those illustrated in the drawings, and some elements and/or components may not be present in various embodiments. Depending on the context, singular terminology used to describe an element or a component may encompass a plural number of such elements or components and vice versa.

BRIEF SUMMARY

Figure 1:
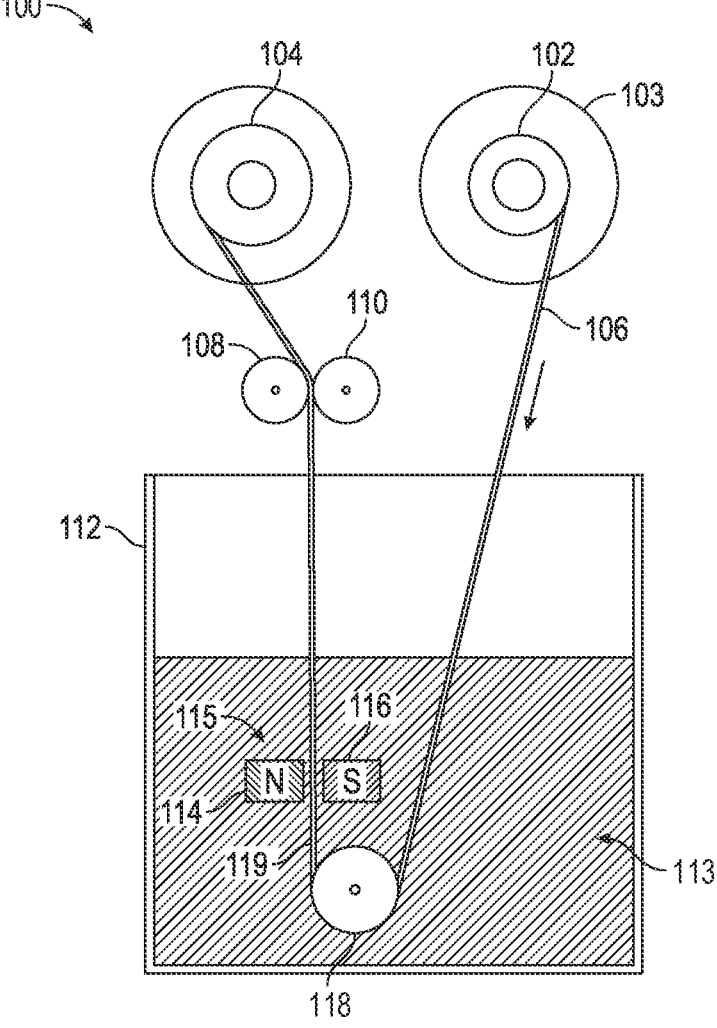
FIG. 1 is a schematic diagram of an apparatus for determining characteristics of a superconducting tape, in accordance with one or more embodiments of the disclosure.

In one aspect, an apparatus is provided that includes (i) one or more reels configured to receive a superconducting tape; (ii) a cryostat including a magnet or electromagnet, and (iii) a first pulley configured to move the superconducting tape through the cryostat and proximate to the magnet or electromagnet.

In another aspect, an apparatus is provided that includes (i) one or more reels configured to receive a superconducting tape; (ii) a cryostat including a magnet or electromagnet; (iii) a first pulley configured to move the superconducting tape through the cryostat and proximate to the magnet or electromagnet; and (iv) one or more second pulleys configured to cause a rotation of the superconducting tape.

In still another aspect, a method is provided that includes (i) moving a superconducting tape through a cryostat, wherein the cryostat includes a magnet or electromagnet, and wherein the superconducting tape is moved proximate to the magnet or electromagnet; (ii) measuring a tension of the superconducting tape using a device; (iii) and determining a critical current of the superconducting tape based on the tension.

DETAILED DESCRIPTION

Energy is critical to every aspect of modern life. However, traditional energy production systems may produce emissions that are harmful to the planet. De-carbonization and electrification are important to reducing harsh emissions and protecting the environment. Superconducting materials, such as REBCO ($REBa_2Cu_3O_{1-\delta}$, where "RE" may refer to a rare earth element) coated conductors (CC) may potentially be applied in nuclear fusion reactors. These reactors have the potential to generate hundreds of megawatts of clean and safe energy using hydrogen isotopes. If successful, fusion power promises to provide more energy for a given weight of fuel than any fuel-consuming energy source currently in use. REBCO CC may also contribute to more classical energy solutions as superconducting generators. While reference may be made herein to the use of REBCO CC, it should be noted that any other type of superconducting material may also be used. Additionally, any general reference to a "superconducting tape" or "tape" may also specifically refer to a REBCO CC tape, in some instances. Further, these systems and methods may also be applicable to other types of superconducting material, such as wires or cables as well.

A potential application for superconducting materials is high-field solenoid magnets for scientific research in which at least part of windings are made with REBCO wires. These magnets would greatly benefit from well-characterized REBCO conductors.

Another application includes accelerator magnets using REBCO conductors. To increase the energy of colliders, a magnetic field that exceeds 20 T may be required. This may also require a large (for example, 600 A/mm$^2$) current density and high (for example, 5-20 kA) operating currents. To achieve such parameters, the conductor must be tested before the cables and magnets are fabricated.

Another potential application includes medicine and pharmaceutical research. These are strong drivers for applied superconductivity that may use REBCO tapes. For instance, a spectrometer may be used in the area of dynamic molecular machines in cancers, for research on proteins linked to neurodegenerative diseases, such as Alzheimer's, Parkinson's Disease, etc. These spectrometers with large magnetic fields use REBCO tape in the central windings. REBCO wires may also be used in medical accelerators for proton cancer treatment. Using REBCO instead of low-temperature superconductors (LTS) would enable more beams for patients. External mini-MRI machines based on REBCO may be used as medical instruments enabling the diagnosis of particular parts of the body, such as joints.

Along with fusion energy, other applications may include, but are not limited to, high-energy physics, strong magnets, and smart electric grids.

The concept of nuclear fusion as a sustainable and clean energy source has been previously explored. However, existing methodologies do not apply high-temperature superconductors (HTS) to achieve improved magnetic plasma confinement. REBCO CC is a material that exhibits high-temperature superconductivity and may be provided in the form of a tape (or other form). However, the characteristics of REBCO tape may not be well known because of the prior lack of an effective quality assurance method. While critical current characterization in short samples of the REBCO tape may be possible, there is no existing method for lengthwise testing of superconducting tapes at low temperatures (for example, below 65 K and/or any other threshold temperature). The systems and methods described herein allow for such testing to be performed, which may provide significant benefits to technologies such as nuclear fusion reactors.

In REBCO tape, the critical current (Ic), as well as other characteristics, may strongly fluctuate at various points along the tape. The critical current may be the current in a superconductive material above which the material is normal and below which the material is superconducting, at a specified temperature and in the absence of external magnetic fields. The method described herein may avoid regions with low critical currents and may also mitigate or prevent quenching of the superconducting tape. Quenching may refer to a sudden loss of superconductivity when the temperature of the superconducting material is raised. In turn, tape regions with too high Ic make intentional quenches difficult. In such high current regions, even if the transport current provided through the device is small, the induced screening currents may damage the device given high electromagnetic forces. Using an effective diagnostic device and method may allow REBCO users to identify the optimal conductor to optimize devices under construction and reduce costs.

In existing methodologies, a current may be injected into a moving superconducting tape and a voltage drop in the superconducting tape may be measured to determine the critical current of the superconducting tape. However, delivering a high current to a moving tape may be difficult. Thus, existing devices may be limited to performing such testing at elevated temperatures (for example, 77 K), where the required currents are much lower. This current is already of the order of 100 A at 77 K and greatly increases when the temperature is lowered. This practically limits measurements to 77 K (for example, liquid nitrogen). At the same time, these tapes are usually used at substantially lower temperatures, such as 4-20 K. There may be a weak correlation between critical current at 77 K and 4-20 K.

Performing testing at these higher temperatures, as is performed in certain existing methods, may have disadvantages because at elevated temperatures the pinning mechanisms are different. A pinning mechanism may refer to the manner in which superconducting vortices are stabilized against Lorentz force in field and can support non-dissipative current. As a consequence, it may not be possible to determine tape characteristics at low temperatures less than or equal to 65 K, for example.

Solutions that measure critical current at elevated temperatures have problems with injecting current to the tape already at elevated temperatures, where the currents used are of the order of 100 A. Critical current strongly increases when temperature is lowered. Thus, at temperatures below 30 K, the currents involved may reach 500-1000 A. It may be difficult to deliver such a high current to the moving tape.

In contrast, the contactless apparatus described herein is configured to operate at these lower temperatures (for example, even temperatures below 30 K), where devices including REBCO may still operate. The systems and methods described herein are based on current induction when external magnetic flux changes in the tape, including a non-invasive diagnostic apparatus that may be used below 30 K. This provides a significant advantage over existing technologies and allows for much faster characterization of the tape than existing solutions.

The method described herein is based on the concept that any conductive surface passing by a magnet develops, according to Faraday's law of induction, circular currents, known as eddy currents. According to Lenz's rule, the eddy currents produce a magnetic field to oppose the changes of an external magnetic field. Thus, the moving conductor experiences a force that opposes its motion. These induced currents and forces are particularly strong in the superconductors, as they have virtually no electric resistance. The force is proportional to the critical current of the superconductor and applied magnetic field. Thus, by measuring the tension of the tape moving through the magnetic field, the critical current at various positions along the superconducting tape may be determined.

An apparatus is provided to facilitate this method for determining characteristics of the superconducting tape at low temperatures (such as the critical current at various points on the superconducting tape, for example). Particularly, the apparatus may include a force magnetometer provided for reel-to-reel assessment of the superconducting tapes. A magnetometer is an apparatus that is used to measure the strength and/or direction of magnetic fields. The apparatus may include a feed-reel and a take-reel around which the superconducting tape may be wound. The apparatus may also include an electric motor (or any other type of motor) used to drive the movement of the superconducting tape into and out of a cryostat. The cryostat may be a vacuum-insulated sample environment that uses liquid cryogens, such as nitrogen or helium, or a mechanical cooler to cool the temperature of a sample. The cryogen may allow for a low temperature (for example, equal to or less than 65K) environment to be created. One or more pulleys may be used to direct the motion of the tape through the cryostat. The superconducting tape may be unwound from the feed-reel by the motor, may pass through the cryostat, and may be received and wound by the take-reel. The apparatus may also include a permanent magnet or electromagnet provided within the cryostat. The configuration of the apparatus may be such that the superconducting tape passes proximate to the magnet while moving through the cryostat. The magnet induces screening currents in the superconducting tape (which gives rise to a force that, according to Lenz rule, is opposite to the moving direction of the superconducting tape). Examples of such an apparatus are provided in FIGS. 1-2.

The current in the electric motor may be proportional to the torque produced by the electric motor. The torque used to move the tape through the magnetic field produced by the magnet provided in the cryostat may be proportional to the superconducting current induced by the magnetic field. Thus, by measuring current through the electric motor, the critical current in the superconducting tape may be determined as a function of position on the superconducting tape.

In one or more embodiments, the apparatus may operate in two modes: (1) a first mode in which the magnetic field is perpendicular to the moving tape (for example, using apparatus 100) and (2) a second mode owing to a certain configuration of pulleys, where the tape rotates as it passed through the magnetic field (for example, using apparatus 200). These two configurations yield the critical current for the magnetic field perpendicular and parallel to the magnetic field, respectively. The second configuration may be beneficial for magnet developers because in the magnet the magnetic field may be oriented parallel or close to parallel with respect to the tape plane. While this apparatus may be designed for REBCO CC conductors, the apparatus may be used with superconducting tapes associated with different architectures as well.

For most applications, lengthy superconducting tapes may be required. An example of such a length may be 10 km, however, any length tape may be applicable. Parameters of these tapes, such as critical current, may vary substantially along the length of the tape. Therefore, it is beneficial to have an apparatus that can perform critical current assessment along the entire length of the superconducting tape. That is, it may not be sufficient to measure short samples taken from the ends of the superconducting tape. Additionally, existing apparatuses based on Hall probe measurement may assess critical current only when the tape is perpendicular to the external magnetic field. However, for many applications (such as electromagnets) a configuration where the magnetic field is parallel to the tape is more beneficial.

The systems and methods described herein, in contrast with existing methods, use contactless induction and measurement by means of force magnetometry. This eliminates problems with providing high current injection to the tape. This also eliminates voltage taps that have the potential to damage the superconducting tape (such as scratching the tape) and problems with electric contacts at the microvolt level. This also allows continuous tape movement to be performed, which increases the speed of the assessment process. This allows the assurance control at much lower temperatures as in liquid Helium (LHe) at 4.2 K or 20 K, for example.

Distinguished from other existing technologies, this method entails critical current characterization of lengthy REBCO CC tape at particular temperatures, magnetic fields, and tape orientations with respect to the background magnetic fields for targeting REBCO CC tape working conditions.

The force opposite to the moving direction of the tape is proportional to the induced current caused by the tape traveling under a stationary magnetic field gradient. In a practical situation, this simplified linear proportion may not hold because of field inhomogeneity. A comprehensive derivation strategy of critical current values that considers field distribution may be beneficial. Equation 1 below may be utilized for the calculation to consider field inhomogeneity and its effect on carrying current, assuming the field is homogeneous along the width direction of the tape. For the first case, when the field is perpendicular to the tape, the angle theta is always zero. For the second case when the tape twists in the field, integration over the angle may be required. In this case, the right side may include thickness, t.

$$F = \int w \cdot \cos(\theta) \cdot \mu_0 H(l) \cdot J_c(T, H, \theta) dl \qquad \text{(Equation 1)}$$

In Equation 1, w is tape width, H(l) is the field distribution function along the tape length direction, and Jc(H, T, $\theta$) is a function of critical current density as magnetic field, temperature, and the angle between the tape plane and magnetic field, for which $\theta$=0 is defined at field perpendicular to tape plane. The integration is conducted on all tape area that contributes to the force.

Field distribution may be attained from the used magnet (for example, superconducting magnets which may be necessary to reach strong background fields up to 20 T). Magnets with a large bore may provide a highly homogeneous field in a specified domain. Depending upon the configuration of the magnet, the force may be calculated using Equation 1. Field distribution directly impacts current distribution in the tape and will in turn impact the magnitude of the force. The field dependence of Jc on magnetic field H is nontrivial, which is governed by the pinning microstructure of the tape and may widely vary with background temperature. Many different functions have been proposed aiming for superconducting magnet design and construction.

In spite of Equation 1, Jc deduction may also depend on the measurement technique of the force. In some instances, the force may be measured from the current required for an electric motor to drive the REBCO tape through the field. Theoretically, the torque of an electric motor is proportional to the current flowing in the armature. The torque is proportional to the current flowing in armature coils under the condition that the magnetic flux is constant, excluding the use of series motors. To localize the tape performance along the tape, stepping motors may be used to keep constant speed during measurement. The synchronous motors may be used for constant speed operation, however, this may lead to position-tracking challenges. An alternative option is to test the force direction using a tension-measuring device, such as a tension meter.

In some cases, analytical Jc deduction may be achieved based on the explicit analysis of the above two relationships, between Jc and the induced force according to Equation 1, along with the relation of force and the tested value depending on force characterization technique. In case that an analytical relation is not reached, numerical simulation using software may be applied. The final correlation, either analytical or numerical may be integrated into data acquisition and system control system, with field distribution, temperature, and test angle as inputs, as illustrated through Equation 1. Jc variation along tape direction may be plotted directly. This method may assume: (1) the measurement of the force versus position on the tape and (2) scaling this to Ic values known from transport measurements from short samples (e.g. from the end).

In terms of magnetic field strength, either superconducting magnet or water-cooled resistive magnet may meet the requirement to generate magnetic field generation up to 20 T. In this regard, considering the huge amount of electricity consumption and limited access, superconducting magnets may be used.

The temperature variant may be controlled via cryogen selection or a cryostat (usually liquid cryogens, including liquid nitrogen and liquid helium) to provide certain temperatures (for example 65-77 K for liquid nitrogen and 1.8 to 4.2 K for liquid helium). The temperature between may be reached by evaporation of liquid helium.

Turning to the figures, FIG. 1 is a schematic diagram of an apparatus 100 for determining characteristics of a superconducting tape, such as a REBCO CC tape. Particularly, FIG. 1 may be a schematic diagram of an example apparatus 100 for the evaluation of the critical current (and/or any other characteristics) of the REBCO CC tape at temperatures ranging from liquid nitrogen temperatures down to liquid helium temperatures (such as less than or equal to 65 K) and magnetic fields up to 20 T, at (1) H/c, and (2) −20 to 20° from the ab plane. The same apparatus 100 shown in FIG. 1 (and the apparatus 200 shown in FIG. 2) may also be applicable to any other type of superconducting tape as well.

A shown in FIG. 1, the superconducting tape 106 may be unwound from a feed-reel 102 and moved through a low temperature region of a cryostat 112. The superconducting tape 106 may then exit the cryostat 112 and be re-wound over a take-reel 104. A low temperature environment may be produced within the apparatus 100 using a cryogenic agent 113 that is provided within the cryostat 112. The cryogenic agent 113 may include, for example, liquid nitrogen (77 K), liquid neon (27 K), liquid helium (4.2 K), flowing liquid helium (4.2-50 K), cryocooler (20-90 K), and/or any other cryogenic agent at any other temperatures. As aforementioned, critical current in superconducting tape at low temperatures (<30 K or any other temperature) may not be determined from high temperature measurements (as 77 K). This is because different pinning mechanisms are responsible in high and low temperatures. Thus, for low temperature applications, the tape may be characterized at low temperatures, such as below 30 K, as a non-limiting example.

In one or more embodiments, a magnet 115 including a first pole 114 and a second pole 116 is provided in the low temperature region of the cryostat 112 proximate to the moving superconducting tape 106. The magnet 115 may be a permanent magnet (for example, 1 T or any other value), a superconducting electromagnet (for example, 0-10 T), or a bulk superconductor with 0-10 T field trapped (or any other type of magnet). One or more pulleys (for example, pulley 108, pulley 110, pulley 118, and/or any other number of pulleys) may be used to guide the superconducting tape 106 through the cryostat 112. The pulley 108 may be a driving pulley that is mechanically connected to an electric motor 103 (although the term "electric motor" is used, any other type of motor may also be used). The electric motor 103 may drive the superconducting tape 106 through the cryostat 112. The electric motor 103 may be provided at the feed-reel 103, the take-reel 104, and/or any other location. In some embodiments, multiple electric motors 103 may be provided (such as a first electric motor at the feed-reel and a second electric motor at the take-reel). The pulley 108 may be responsible for directing the movement of the superconducting tape 106 as it is driven by the electric motor 103. The pulley 110 may be used to press the superconducting tape 106 towards the pulley 108 (the driving pulley) to avoid sliding of the superconducting tape 106.

The tension of the tape 106 may be measured by a tension meter 119. A tension meter is a device used to measure tension in elements such as wires, cables, belts, etc. The tension meter 119 may be provided between the motor moving the superconducting tape 106 and the magnet 115. The tension meter 119 may be provided at room temperature outside of the cryostat 112. The tension meter 119 may also be provided at any other location internal or external to the cryostat 112 as well.

The tension on the superconducting tape 106 as measured by the tension meter 119 is proportional to the critical current of the superconducting tape 106 and applied magnetic field. Thus, by measuring the tension of the superconducting tape 106 moving through magnetic field, the critical current at various positions along the superconducting tape 106 may be determined.

An alternative approach may involve measuring the current feeding the electric motor 103. This current is proportional to the load of the electric motor 103 (that is, the torque the electric motor 103 generates to move the superconducting tape 106). The torque, in turn, is proportional to the tension of the superconducting 106 produced by electromagnetic forces. Thus, the tension of the superconducting 106 may also be determined in this manner based on the current rather than directly measuring the tension using the tension meter 119.

In one or more embodiments, the superconducting tape 106 may move through the magnetic field produced by the magnet 115 in two configurations. The first configuration, shown in FIG. 1, involves the magnetic field being perpendicular to the superconducting tape 106 that is parallel to the c-axis of the superconductor.

However, in many applications (such as electromagnets) the magnetic field is in the plane of the tape or around (for example, −20 to 20 degrees from an "ab" plane). The ab plane may be a crystallographic plane of REBCO compound. The ab plane may be parallel to the REBCO tape plane. Moreover, Ic (c) and Ic (a b) may not be proportional. Instead, their ratio (anisotropy) may vary by local on a given superconducting tape, may vary between different superconducting tapes, and/or may depend on external parameters, such as magnetic field and temperature. In order to measure current around the ab plane, the superconducting tape 106 may gradually be rotated by 180 degrees (or any other amount) in the region of the magnetic field.

Figure 2:
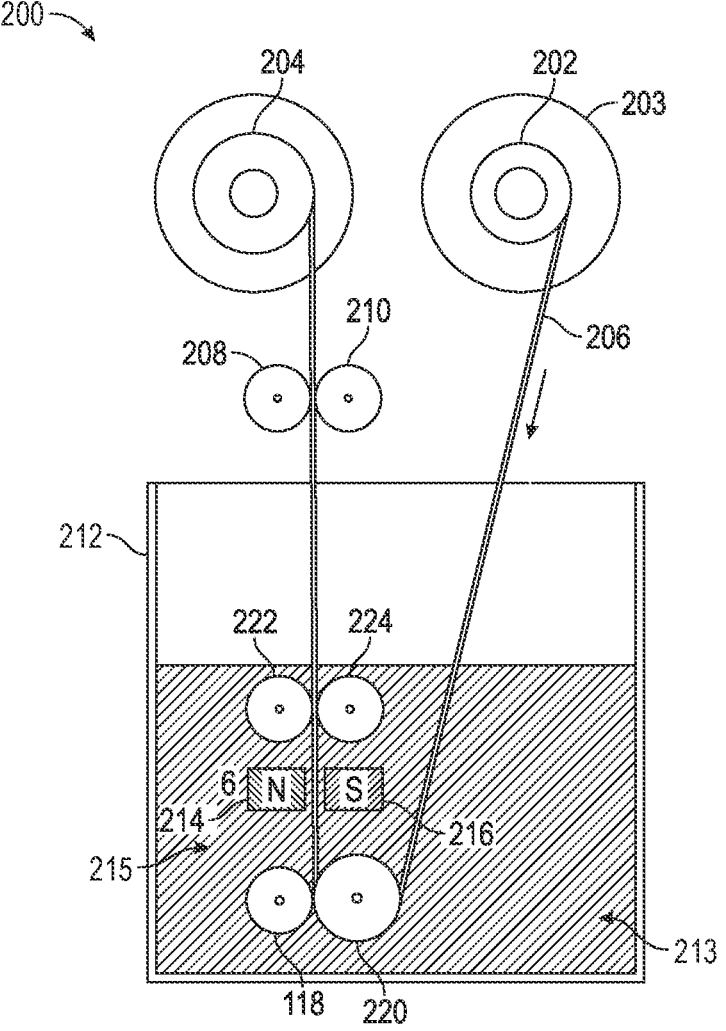
FIG. 2 is another schematic diagram of an apparatus for determining characteristics of a superconducting tape, in accordance with one or more embodiments of the disclosure.

FIG. 2 shows another apparatus 200 associated with this second configuration. The apparatus 200 includes some similar components as the apparatus 100. For example, the apparatus includes a feed-reel 202, a take-reel 204, a tape 206, a magnet 215, a cryostat 212 including a cryogenic agent 213, an electric motor 203, and one or more pulleys.

In contrast with the apparatus 100, additional pulleys are provided in the apparatus 200 to provide for the rotation of the superconducting tape 206. For example, deflector pulleys 222, 224, and 218 may provide for the rotation of the superconducting tape 206 (however, any other number of pulleys may be used). In the coordinates of the superconducting tape 206, the magnetic field rotates around the superconducting tape 206, inducing screening currents corresponding to the Blab configuration. Tension may be measured between the magnet 215 and pulleys 208 and 210 where the superconducting tape 206 is straight.

A number of challenges may be involved in this process. A first challenge may involve providing a uniform and stable characterization environment. This challenge arises from the possible temperature and field instability during critical current measurement. Additionally, REBCO tape moving might occur due to occasionally force unbalance. This challenge may be addressed by using a second temperature control unit, theoretical calculation, and correct tape support during critical current evaluation Over LHe there may exist a slow temperature gradient in the cryostat. The active portion of the device (for example, the portion of the device in which the tape travels through the magnetic field) may be placed in this gradient at a temperature lower than desired (e.g., at 15 K if measurement is at 20 K). An electric heater controlled by the thermometer may maintain the temperature of the tape. The thermometer may be placed in one of the pulleys and connected using a brushless rotating connector.

A second challenge may involve effectively and safely driving the superconducting tape through a wide temperature and magnetic field variation. Due to the large torque that may be induced, the tape has the potential to be damaged. Another technical concern is that cryogen loss might be unavoidable as the tape travels from room temperature and cryogenic temperature. A rigorous calculation and dedicated system design may address this challenge.

It is known that cooling 1 kg of copper from room temperature to 4.2 K requires boiling off 22 liters of LHe. Thus, 100 m of tape may evaporate 0.8 liter or less, since the tape traveling back to room temperature exchanges heat. Given that the system may operate in a sealed container, He gas losses may be minimal.

A third challenge may involve practical use of the electric motor as a torque meter. Torque measurement using an electric motor is based on the working principle of electric motor. A device may be developed to fulfill the function under the guidance of model simulation. In one or more embodiments, there may be two types of devices used for quality control of superconducting tapes. A first device may involve screening currents induced in the tape measured by Hall probes. There are many solutions like this constructed. Most of them measure remnant field, some of them measure penetration field. A second device may involve critical current measured by means of four-probe transport measurement. The transport current may be injected to the tape at low temperature. The voltage may be measured by voltage taps contacting the superconducting tape.

Before assembly, each individual apparatus, including the driving unit, temperature control, tape support, system monitor and control, and data acquisition and processing may be tested individually first at liquid nitrogen, and then in liquid helium.

REBCO tapes of any varying dimensions and critical current specifications may be used. In some instances, approximately 50 m long dummy tapes with approximately 4 mm width may be used (however, any other REBCO tapes may also be used as well).

A 1 T (or any other value) electromagnet may be used to test the assembled apparatus at liquid nitrogen temperature and magnetic fields. The electromagnet is equipped with a cryostat that may be filled with liquid cryogens to enable cryogenic temperature test, and has been used routinely for angular dependence of critical current of short REBCO samples. In some instances, liquid nitrogen may be used for feasibility demonstration. The system may be tested on copper tapes and then on REBCO tapes. This is merely exemplary and not intended to be limiting.

To eliminate the possibility of tape degradation caused by testing system, short samples at 10 points with critical current values ranging from 10%, 20%, 30%, etc. to 100% maximum critical current may be cut from the long tape, and may be tested using critical current probes for short samples. Among these 10 samples, three represented samples may be evaluated under optical microscope, magneto optical microscope, scanning electron microscope and transmission electron microscope if required, to investigate critical current variation mechanisms.

The repeatability test may be conducted by warming up the tested REBCO tape to room temperature and run the tap through the system again. This process may be repeated 10 times 9 or any other number of times), and the median critical current and distribution may be deducted. One goal may be to restrict critical current standard deviation, $\sigma$ for same position within 5%. System troubleshooting and optimization may be conducted until $\sigma<5\%$. Another three sets of experiments (or any other number of experiments) may be repeated to ensure final repeatability.

Figure 3:
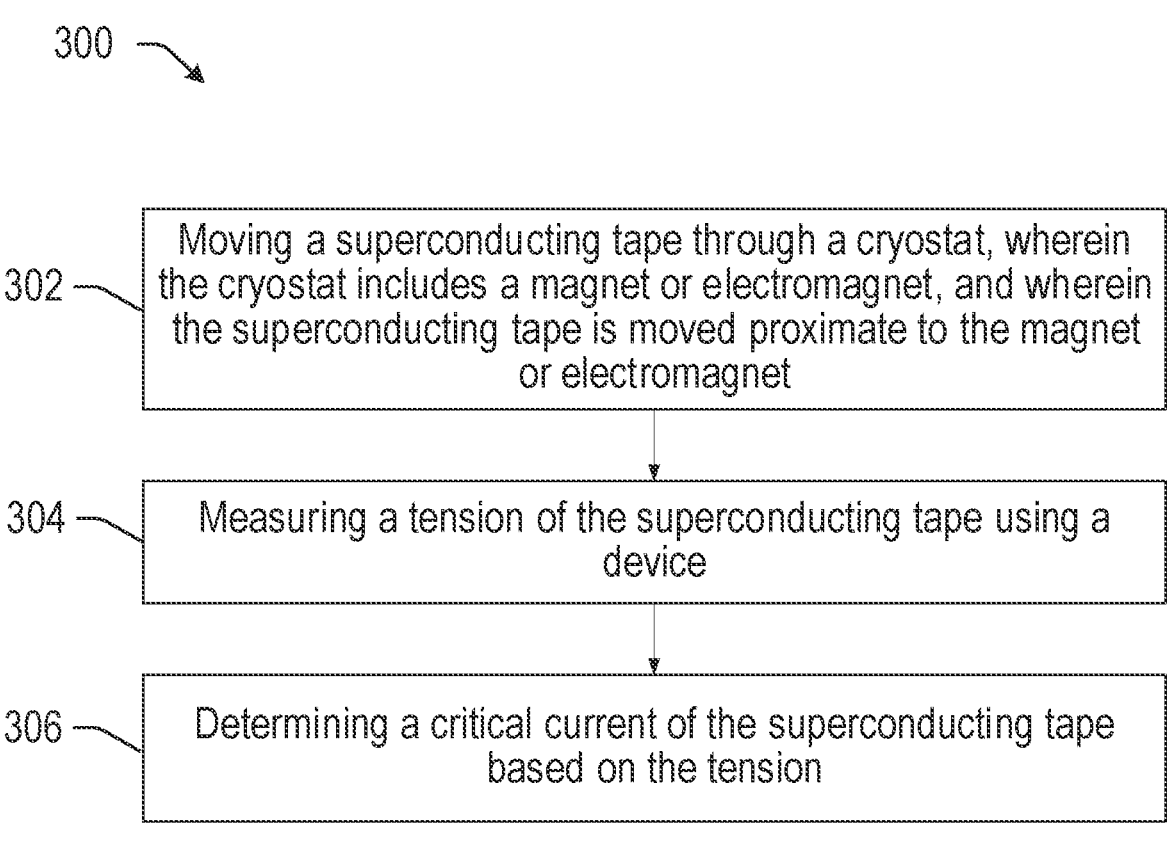
FIG. 3 is a method for determining characteristics of a superconducting tape, in accordance with one or more embodiments of the disclosure.

FIG. 3 is an example method 300 for measuring characteristics of a superconducting tape at low temperatures. Some or all of the blocks of the process flows in this disclosure may be performed in a distributed manner across any number of devices or systems. The method 300 may be performed using an apparatus such as the apparatus 100 or the apparatus 200, for example. The operations of the process flow 300 may be optional and may be performed in a different order.

Block 302 of the method involves moving a superconducting tape through a cryostat, wherein the cryostat includes a magnet or electromagnet, and wherein the superconducting tape is moved proximate to the magnet or electromagnet. The cryostat may be provided as a part of an apparatus, such as the apparatus 100 of FIG. 1 or the apparatus of FIG. 2.

In one or more embodiments, superconducting tape may be unwound from a feed-reel and moved into the cryostat. The superconducting tape may then exit the cryostat and be re-wound over a take-reel. A magnet may be provided in the cryostat proximate to the moving superconducting tape. One or more pulleys may be used to guide the superconducting tape through the cryostat. One pulley may be a driving pulley that is mechanically connected to an electric motor (although the term "electric motor" is used, any other type of motor may also be used). The electric motor may drive the superconducting tape through the cryostat. The pulley may be responsible for directing the movement of the superconducting tape as it is driven by the electric motor. Another pulley may be used to press the superconducting tape towards the pulley (the driving pulley) to avoid sliding of the superconducting tape.

Block 304 of the method 300 involves measuring a tension of the superconducting tape using a device. In one or more embodiments, tension of the superconducting tape may be measured by a tension meter. The tension meter may be provided between the motor moving the superconducting tape through the cryostat and the magnet or electromagnet, for example.

Block 306 of the method 300 involves determining a critical current of the superconducting tape based on the tension. The tension on the superconducting tape as measured by the tension meter is proportional to the critical current of the superconducting tape and applied magnetic field. Thus, by measuring the tension of the superconducting tape moving through magnetic field, the critical current at various positions along the superconducting tape may be determined.

An alternative approach may involve measuring the current feeding the electric motor 103. This current is proportional to the load of the electric motor (that is, the torque the electric motor generates to move the superconducting tape). The torque, in turn, is proportional to the tension of the superconducting produced by electromagnetic forces. Thus, the tension of the superconducting may also be determined in this manner based on the current rather than directly measuring the tension using the tension meter.

Conditional language, such as, among others, "may," "could," "might," or "may," unless specifically stated otherwise, or otherwise understood within the context as used, is generally intended to convey that certain implementations could include, while other implementations do not include, certain features, elements, and/or operations. Thus, such conditional language generally is not intended to imply that features, elements, and/or operations are in any way required for one or more implementations or that one or more implementations necessarily include logic for deciding, with or without user input or prompting, whether these features, elements, and/or operations are included or are to be performed in any particular implementation.

What has been described herein in the present specification and annexed drawings includes examples of systems, devices, techniques, and computer program products that, individually and in combination, certain systems and methods. It is, of course, not possible to describe every conceivable combination of components and/or methods for purposes of describing the various elements of the disclosure, but it may be recognized that many further combinations and permutations of the disclosed elements are possible. Accordingly, it may be apparent that various modifications may be made to the disclosure without departing from the scope or spirit thereof. In addition, or as an alternative, other embodiments of the disclosure may be apparent from consideration of the specification and annexed drawings, and practice of the disclosure as presented herein. It is intended that the examples put forth in the specification and annexed drawings be considered, in all respects, as illustrative and not limiting. Although specific terms are employed herein, they are used in a generic and descriptive sense only and not for purposes of limitation.

What is claimed is:

1. A method comprising:
moving a superconducting tape through a cryostat, wherein the cryostat includes a magnet or electromagnet, and wherein the superconducting tape is moved proximate to the magnet or electromagnet;
measuring a tension of the superconducting tape using a device; and
determining a critical current of the superconducting tape based on the measured tension without a current being injected into the superconducting tape.

2. The method of claim 1, wherein the device is a tensionmeter.

3. The method of claim 1, wherein a cryogenic agent is provided in the cryostat, and wherein a temperature of the cryostat is less than or equal to 65K.

4. The method of claim 1, wherein the superconducting tape is moved through the cryostat using one or more first pulleys.

5. The method of claim 4, further comprising:
rotating the superconducting tape using one or more second pulleys.

6. The method of claim 4, further comprising:
pressing the superconducting tape against the one or more first pulleys using a pressing pulley to avoid sliding of the superconducting tape.

7. The method of claim 1, wherein a magnetic field produced by the magnet or electromagnet is perpendicular to the superconducting tape.

8. The method of claim 1, further comprising:
unwinding the superconducting tape from a feed-reel; and
re-winding the superconducting tape over a take-reel after the superconducting tape exits the cryostat.

9. The method of claim 1, wherein a cryogenic agent is provided in the cryostat, and wherein the cryogenic agent comprises liquid helium.

10. The method of claim 1, wherein the magnet or electromagnet comprises a superconducting electromagnet.

11. The method of claim 1, wherein the device is at room temperature outside of the cryostat.

12. The method of claim 1, wherein the superconducting tape is moved through the cryostat using an electric motor.

13. The method of claim 1, wherein determining the critical current comprises determining the critical current at two or more positions along the superconducting tape.

* * * * *